United States Patent
Chang et al.

(10) Patent No.: US 11,784,087 B2
(45) Date of Patent: Oct. 10, 2023

(54) SEMICONDUCTOR STRUCTURE HAVING LAYERS IN A TRENCH AND METHOD OF MANUFACTURING THE SAME

(71) Applicant: Winbond Electronics Corp., Taichung (TW)

(72) Inventors: Hao Chuan Chang, Taichung (TW); Kai Jen, Taichung (TW)

(73) Assignee: WINBOND ELECTRONICS CORP., Taichung (TW)

( * ) Notice: Subject to any disclaimer, the term of this patent is extended or adjusted under 35 U.S.C. 154(b) by 0 days.

(21) Appl. No.: 17/140,627

(22) Filed: Jan. 4, 2021

(65) Prior Publication Data
US 2021/0210376 A1 Jul. 8, 2021

(30) Foreign Application Priority Data
Jan. 8, 2020 (TW) .................................. 109100545

(51) Int. Cl.
*H01L 21/762* (2006.01)

(52) U.S. Cl.
CPC .............................. *H01L 21/76224* (2013.01)

(58) Field of Classification Search
CPC ............. H01L 21/76224; H01L 21/763; H01L 21/02436; H01L 21/02439; H01L 21/02441; H01L 21/0245; H01L 21/02494; H01L 21/02496; H01L 21/02505; H01L 21/76; H01L 21/762; H01L 21/76229
See application file for complete search history.

(56) References Cited

U.S. PATENT DOCUMENTS

| 10,964,718 | B2 * | 3/2021 | Xiao | .................... H01L 27/1157 |
| 11,018,151 | B2 * | 5/2021 | Kaneko | ............. H01L 29/40114 |
| 2002/0168850 | A1 * | 11/2002 | Kim | .................. H01L 21/76235 |
|  |  |  |  | 438/637 |
| 2003/0119256 | A1 | 6/2003 | Dong et al. | |
| 2004/0058549 | A1 | 3/2004 | Ho et al. | |
| 2007/0072387 | A1 | 3/2007 | Lai et al. | |
| 2011/0117724 | A1 * | 5/2011 | Ko | .................. H01L 21/823878 |
|  |  |  |  | 257/E21.549 |

(Continued)

FOREIGN PATENT DOCUMENTS

CN 1893015 A * 1/2007 ....... H01L 21/28273

OTHER PUBLICATIONS

Chinese Office Action corresponding to patent application 202110007704.1 dated Apr. 26, 2023; pp. 1-9.

*Primary Examiner* — Phat X Cao
*Assistant Examiner* — William Henry Anderson
(74) *Attorney, Agent, or Firm* — Muncy, Geissler, Olds & Lowe, P.C.

(57) ABSTRACT

A semiconductor structure and its manufacturing method are provided. The semiconductor structure includes a substrate having a trench. The semiconductor structure also includes an oxide layer conformally formed in the trench and a protective layer formed in the trench. Also, the protective layer is conformally formed on the oxide layer. The semiconductor structure further includes an insulating material layer in the trench, and the insulating material layer is formed above the protective layer, wherein a top surface of the insulating material layer is higher than a top surface of the protective layer.

16 Claims, 10 Drawing Sheets

(56) References Cited

U.S. PATENT DOCUMENTS

| | | | | |
|---|---|---|---|---|
| 2012/0202327 A1* | 8/2012 | Lehnert | ............... | H01L 21/0262 |
| | | | | 257/E21.409 |
| 2018/0114726 A1* | 4/2018 | Odnoblyudov | ..... | H01L 27/0605 |
| 2018/0158828 A1* | 6/2018 | Han | .................. | H01L 21/76804 |
| 2018/0374741 A1* | 12/2018 | Tutuc | .................. | H01L 29/7802 |
| 2020/0075397 A1* | 3/2020 | Chen | .................. | H01L 21/0228 |
| 2020/0144272 A1* | 5/2020 | Kumar | ................ | H01L 29/4966 |

* cited by examiner

SEMICONDUCTOR STRUCTURE HAVING LAYERS IN A TRENCH AND METHOD OF MANUFACTURING THE SAME

CROSS REFERENCE TO RELATED APPLICATIONS

This Application claims priority of Taiwan Patent Application No. 109100545, filed on Jan. 8, 2020, the entirety of which is incorporated by reference herein.

BACKGROUND

Field of the Disclosure

The present disclosure relates to a semiconductor structure and its manufacturing method, and in particular, it relates to a semiconductor structure having trench isolation features and its manufacturing method.

Description of the Related Art

With the rapid development of integrated circuits (ICs), the size of memory device components has been decreased, in order to meet the commercial requirements for miniaturized electronic devices. The degree of integration of components in a memory device increases as the size of the electronic device is reduced. When the size of the components in an electronic device is reduced to increase the degree of integration, isolation structures that are disposed between the components in the memory device are also reduced in size. The isolation effect of the isolation structures is also one of the most important factors affecting the electrical properties of the memory device. In recent years, shallow trench isolation (STI) technology has been widely used in sub-micron or smaller integrated circuit manufacturing processes. Moreover, the components required for forming the memory devices are disposed on the active areas and positioned on both sides of the isolation structures.

However, isolation structures may become damaged in the current processes used for fabricating memory devices, and this may cause the isolation structures to have uneven surfaces. Also, it may be difficult to control the height difference (also known as the step height) between the top surfaces of the isolation structures and the top surfaces of the active areas. The isolation structures that are formed according to the current processes for fabricating memory devices are not ideal, so the components disposed on the active areas and positioned on the two sides of the isolation structures may have problems, such as current leakage and low programming speed, thereby affecting the electrical performance of the memory devices. The aforementioned problems decrease the production yield and reliability of the final products.

Although existing semiconductor structures and methods for manufacturing the same have generally been adequate for their intended purposes, they have not been entirely satisfactory in all respects. There are still some problems to be overcome in regards to the semiconductor structures and its manufacturing methods. Thus, it is important for manufactures to improve their semiconductor structures, in particular the structures of resistive random access memory, to prevent the above-mentioned situations.

SUMMARY

In some embodiments of the disclosure, a semiconductor structure is provided. The semiconductor structure includes a substrate having a trench. In some embodiments, the semiconductor structure also includes an oxide layer conformally formed in the trench. In some embodiments, the semiconductor structure further includes a protective layer in the trench, and the protective layer is conformally formed on the oxide layer. In some embodiments, the semiconductor structure further includes an insulating material layer in the trench, and the insulating material layer is formed above the protective layer, wherein the top surface of the insulating material layer is higher than the top surface of the protective layer. Also, in some embodiments, the semiconductor structure further includes a nitride layer in the trench, and a nitride layer is conformally formed on the protective layer. The insulating material layer is formed on the nitride layer, wherein the top surface of the nitride layer is level with the top surface of the insulating material layer.

In some embodiments of the disclosure, a method of manufacturing a semiconductor structure is provided. In some embodiments, the method includes providing a substrate having a trench. An oxide layer and a protective layer are sequentially formed on the substrate, wherein the oxide layer and the protective layer are conformally formed in the trench, thereby forming an opening in the trench. In some embodiments, the method further includes forming a sacrificial material above the protective layer, and the opening is filled with the sacrificial material. In some embodiments, the method further includes removing a portion of the sacrificial material to expose the top surface of the protective layer, and removing the remaining portion of the sacrificial material to expose the opening. In some embodiments, the method further includes forming an insulating material layer in the opening, and removing a portion of the protective layer to expose the top surface of the oxide layer. After the portion of the protective layer is removed, the top surface of the insulating material layer is higher than the top surface of the protective layer.

BRIEF DESCRIPTION OF THE DRAWINGS

The present disclosure can be further understood by reading the subsequent detailed description and examples with references made to the accompanying drawings, wherein:

FIGS. 1A, 8A, 9A, 10A, 11A and 12A are cross-sectional views of the structures along the cross-sectional line 2-2 in FIGS. 1B, 8B, 9B, 10B, 11B and 12B.

FIG. 13 is a cross-sectional view of another semiconductor structure in accordance with some embodiments of the present disclosure.

DETAILED DESCRIPTION

The present disclosure is described in detail with reference to the figures of the embodiments of the present disclosure. It should be appreciated, however, that the present disclosure can be embodied in a wide variety of implementations and is not limited to embodiments described in the disclosure. Various features may not be drawn to scale for the sake of simplicity and clarity. Some embodiments are described below. Throughout the various views and illustrative embodiments, similar reference numbers are used to designate similar features and components.

Embodiments of the present disclosure provide a semiconductor structure and a method of manufacturing the same. According to the embodiments, the semiconductor structure is a substrate structure having trench isolation features. In some embodiments, a substrate having a trench is provided, and an oxide layer is conformally formed in the trench. As a result of the protective layer conformally formed on the oxide layer and the related steps of the manufacturing method, the height difference (also referred to as the "step height") between the top surface of the trench isolation features and the top surface of the oxide layer outside the trench can be controlled by adjusting the thickness of the protective layer. Therefore, the problems controlling the height of the components, caused by oxide loss in the trench isolation features in the conventional manufacturing method, can be solved. According to the method of manufacturing the semiconductor structure in some embodiments, the electrical properties and operating performance of the electronic features subsequently formed on the semiconductor structure in accordance with some embodiments can be significantly improved.

In addition, the semiconductor structure disclosed in some embodiments is positioned in a peripheral region of a semiconductor device, and four active areas $A_A$ are depicted from a top view of a substrate. Also, the cross-sectional views used for illustrating various stages of manufacturing a semiconductor structure and structural configurations thereof depict two adjacent active areas in a peripheral region of a semiconductor device and a trench isolation feature formed between the two active areas. However, the disclosure is not limited in those illustrating stages.

For the sake of simplicity and clarity, FIGS. 1A, 1B, 2, 3, 4, 5, 6, 7, 8A, 8B, 9A, 9B, 10A, 10B, 11A, 11B, 12A, 12B, and 13 illustrate a method of manufacturing a semiconductor structure having one trench isolation feature formed between two adjacent active areas in a peripheral region of a semiconductor device, in accordance with some embodiments of the present disclosure.

Figure 1A:
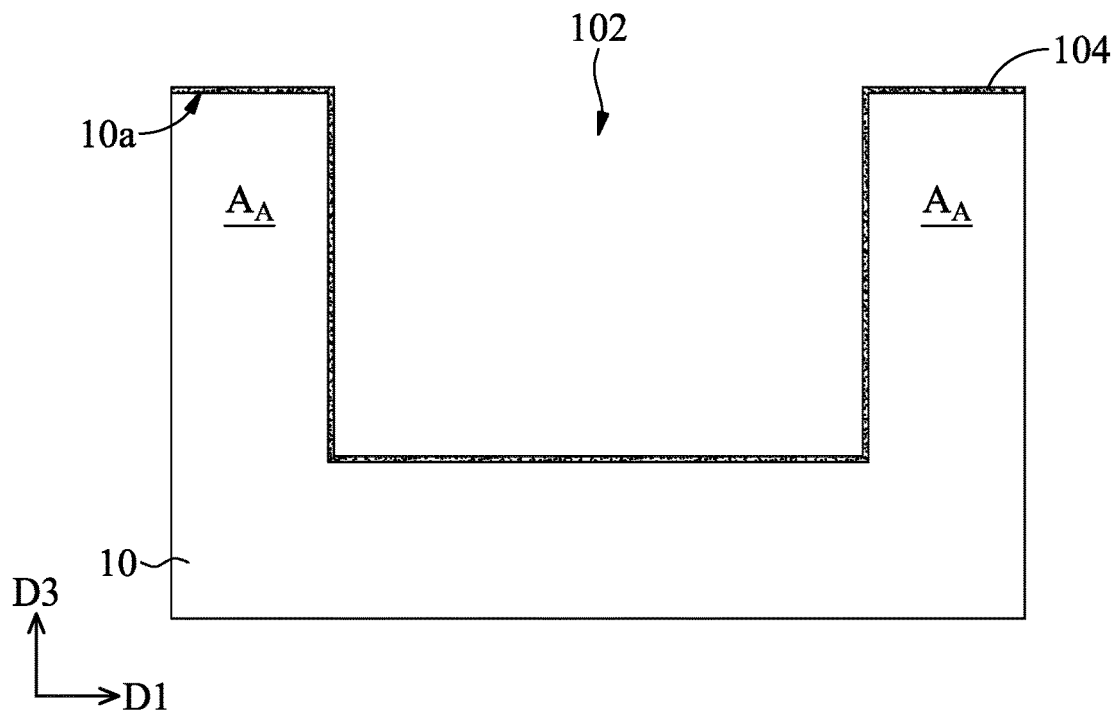
FIGS. 1A, 1B, 2, 3, 4, 5, 6, 7, 8A, 8B, 9A, 9B, 10A, 10B, 11A, 11B, 12A, 12B, and 13 illustrate a method of manufacturing a semiconductor structure in accordance with some embodiments of the present disclosure.
Figure 1B:
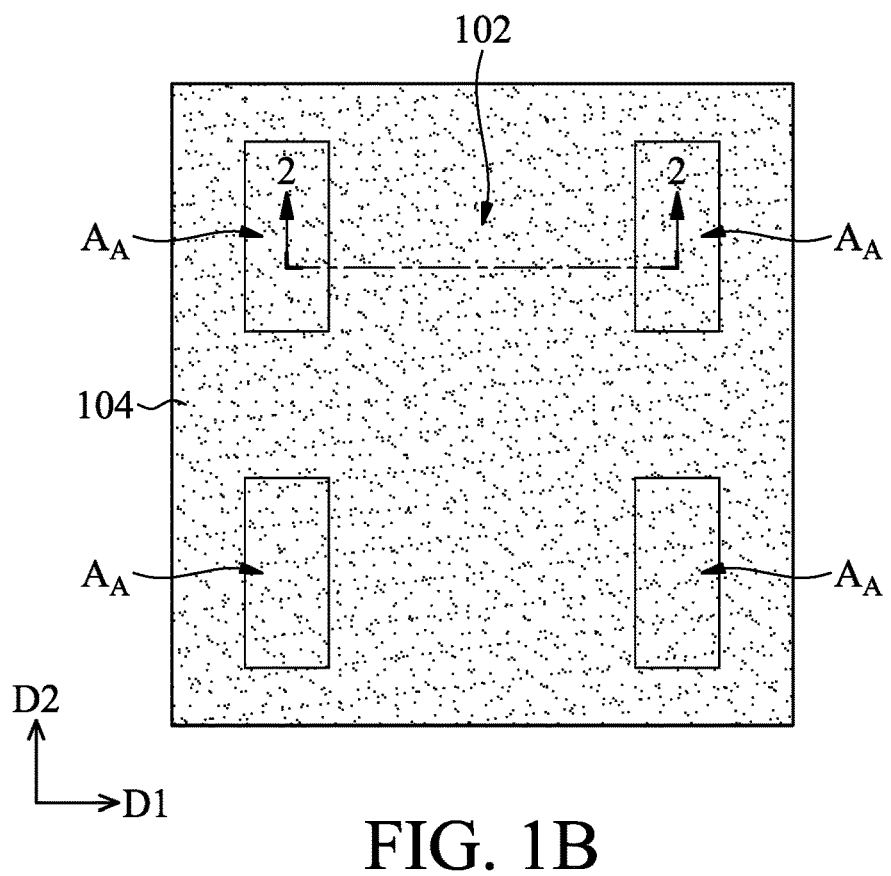

Referring to FIG. 1A and FIG. 1B, a substrate 10 is provided. In some embodiments, the substrate 10 includes several trenches 102 and several active areas $A_A$, wherein the active areas $A_A$ are separated from each other by the trenches 102. As shown in FIG. 1A, it depicts two adjacent active areas $A_A$ correspondingly along the cross-sectional line 2-2 in FIG. 1B and the trench 102 between the active areas $A_A$. As shown in FIG. 1B, the cross-sectional line 2-2 is in parallel with the first direction D1, and the trench 102 is extended along the second direction D2.

After the substrate 10 is provided, an oxidation process is performed to form a first oxide layer 104 on the surface of the substrate 10. As shown in FIG. 1A, the first oxide layer 104 is conformally formed on the sidewalls and the bottom surface of the trench 102, and also formed on the top surface 10a of the substrate 10 outside the trench 102. Accordingly, the cross-sectional profile of the first oxide layer is corresponding to and the same as the cross-sectional profile of the substrate 10 having the trench 102. In some embodiments, the oxidation process includes a thermal oxidation process to oxidize the substrate 10. In this example, the substrate 10 is made of a material including silicon, and the first oxide layer includes silicon oxide.

Figure 2:
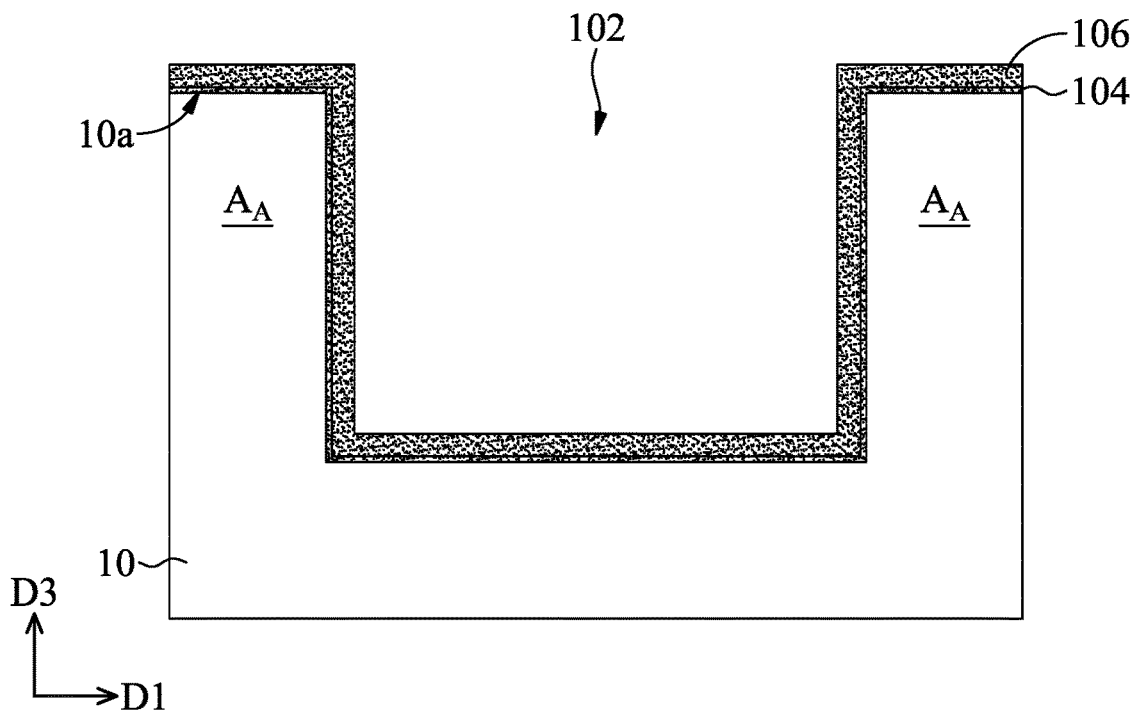

Referring to FIG. 2, a second oxide layer 106 is conformally formed on the first oxide layer 104. Formation of the first oxide layer 104 can eliminate the damages and defects on the surface of the substrate 10, so that a high-quality second oxide layer 106 can be subsequently deposited. Also, those oxide layers are extended to the top surface 10a of the substrate 10 to cover the top surface 10a of the substrate 10. Accordingly, a top surface 106a of the second oxide layer 106 above the top surface 10a of the substrate 10 that is outside the trench 102 can be defined, as shown in FIG. 2.

In some embodiments, the second oxide layer 106 includes silicon oxide, and can be formed by atomic layer deposition (ALD). In some embodiments, the thickness of the second oxide layer 106 is in a range of about 6 nm to about 10 nm.

According to some embodiments of the disclosure, a protective layer is formed on the oxide layers after forming the oxide layers (e.g. the first oxide layer 104 and the second oxide layer 106). The height difference between the top surface of the subsequently formed trench isolation features and the top surface of the oxide layers outside the trench can be controlled by forming a protective layer. The details of forming the protective layer are described below.

Figure 3:
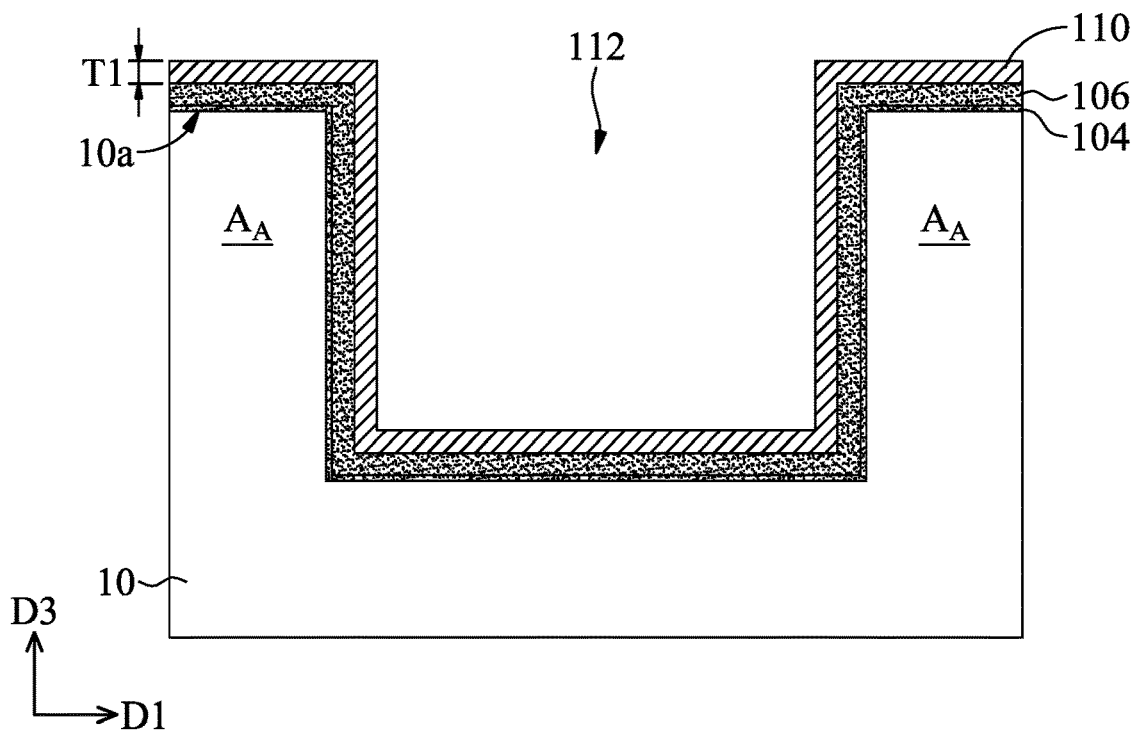

Referring to FIG. 3, in some embodiments, a protective layer 110 is conformally formed on the second oxide layer 106. The protective layer 110 has a thickness of T1. In some embodiments, the protective layer includes a polysilicon layer, and can be formed by chemical vapor deposition (CVD) or another suitable deposition method. In some embodiments, the thickness T1 of the protective layer 110 is in a range of about 20 nm to about 30 nm.

Figure 4:
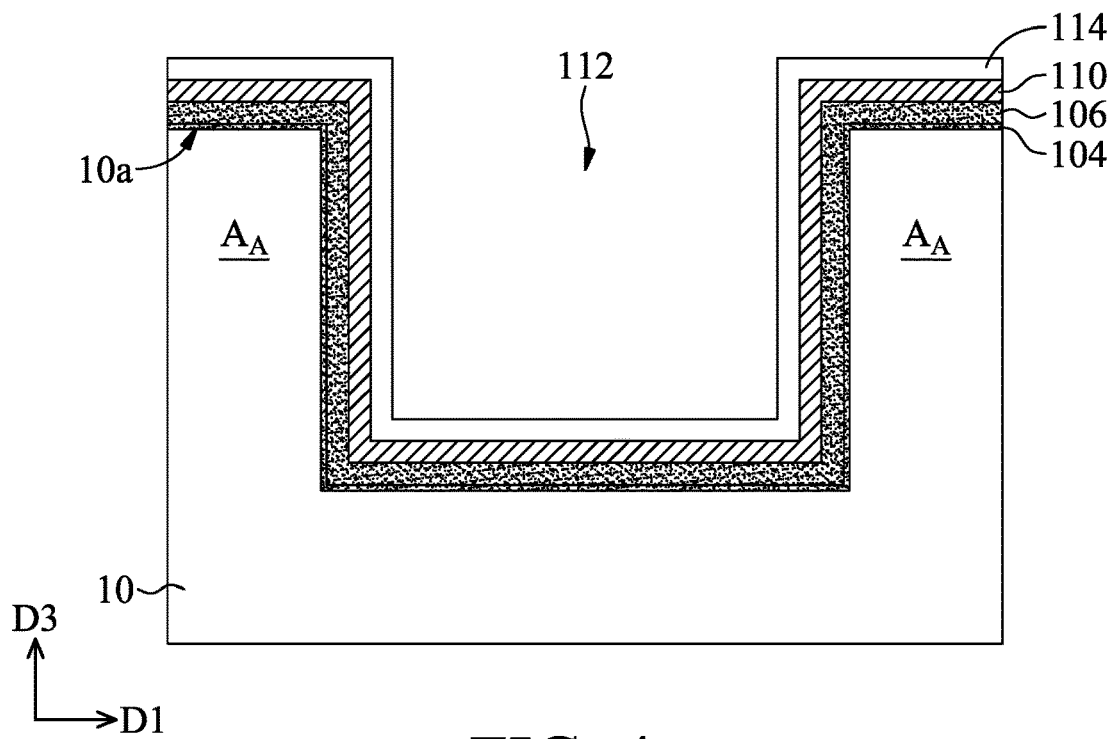

Referring to FIG. 4, in some embodiments, a nitride layer 114 is conformally formed on the protective layer 110, thereby forming an opening in the trench 102. In some embodiments, the nitride layer 114 includes silicon nitride, and can be formed by chemical vapor deposition (CVD). In some embodiments, the thickness of the nitride layer 114 is in a range of about 20 nm to about 30 nm.

Figure 5:
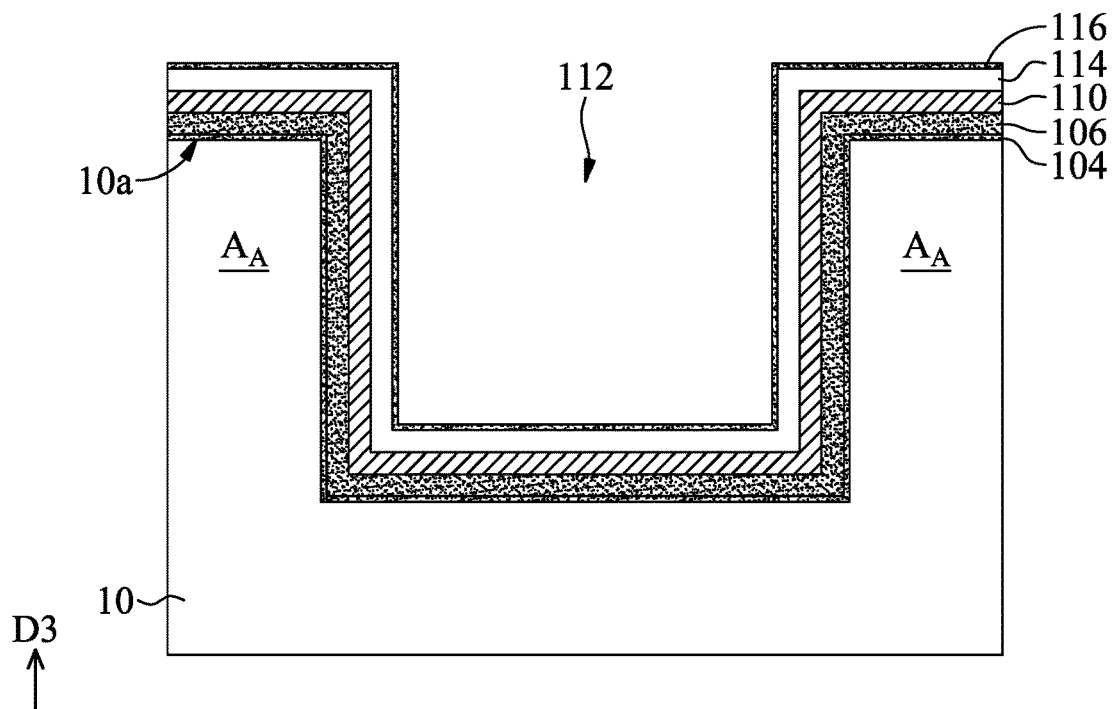

Referring to FIG. 5, after the nitride layer 114 is formed, in accordance with some embodiments, a native oxide 116 is immediately formed on the nitride layer 114 and conformally formed along the nitride layer 114.

In this example, before the opening 112 is filled with one or more suitable insulating materials, a sacrificial material is formed in the opening 112. This is followed by related processes. Therefore, the level of the top surface of the nitride layer 114 adjoining the subsequently formed trench isolation features can be defined. The details of forming the sacrificial material and the related processes are described below.

Figure 6:
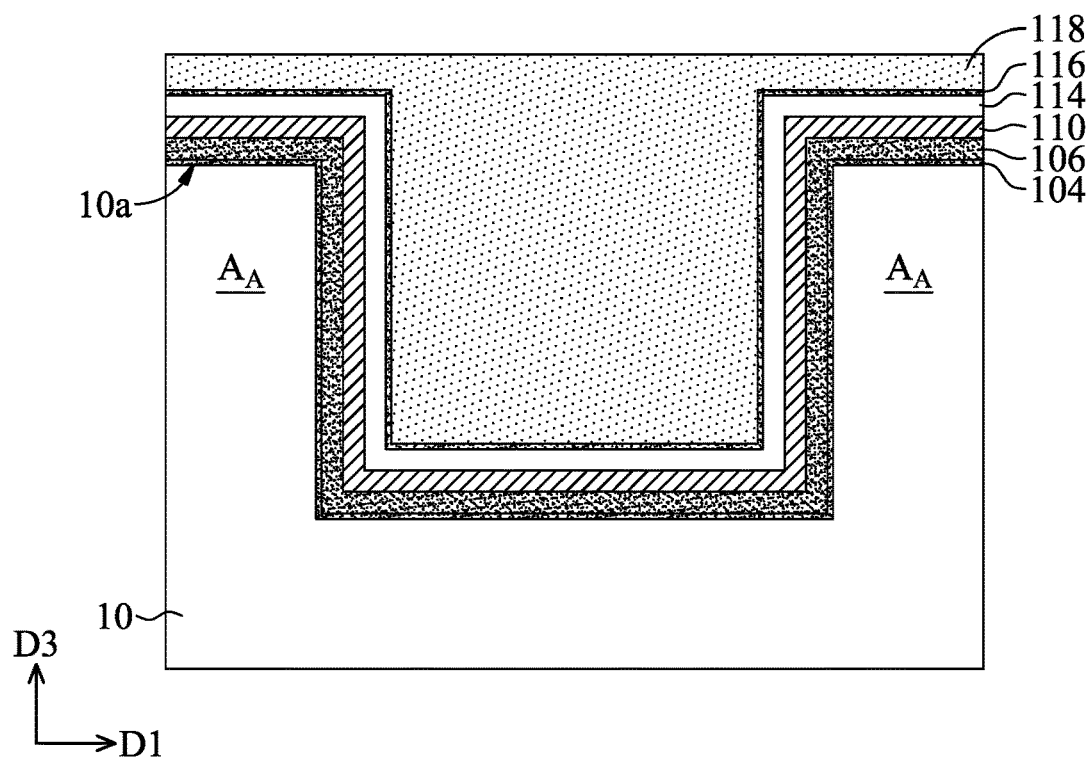

Referring to FIG. 6, a sacrificial material 118 is formed above the nitride layer 114, and the opening 112 is filled with the sacrificial material 118. In this example, the sacrificial material 118 on the nitride layer 114 is in direct contact with the native oxide 116. In some embodiments, the sacrificial material 118 on the nitride layer 114 is formed by spin-on deposition. The sacrificial material 118 may include spin-on-carbon (SOC), or another suitable material. Spin-coated carbon, which can be used as a hard mask in semiconductor processes, has good gap-filling characteristics and can be selected as the sacrificial material 118 for filling up the opening 112.

Figure 7:
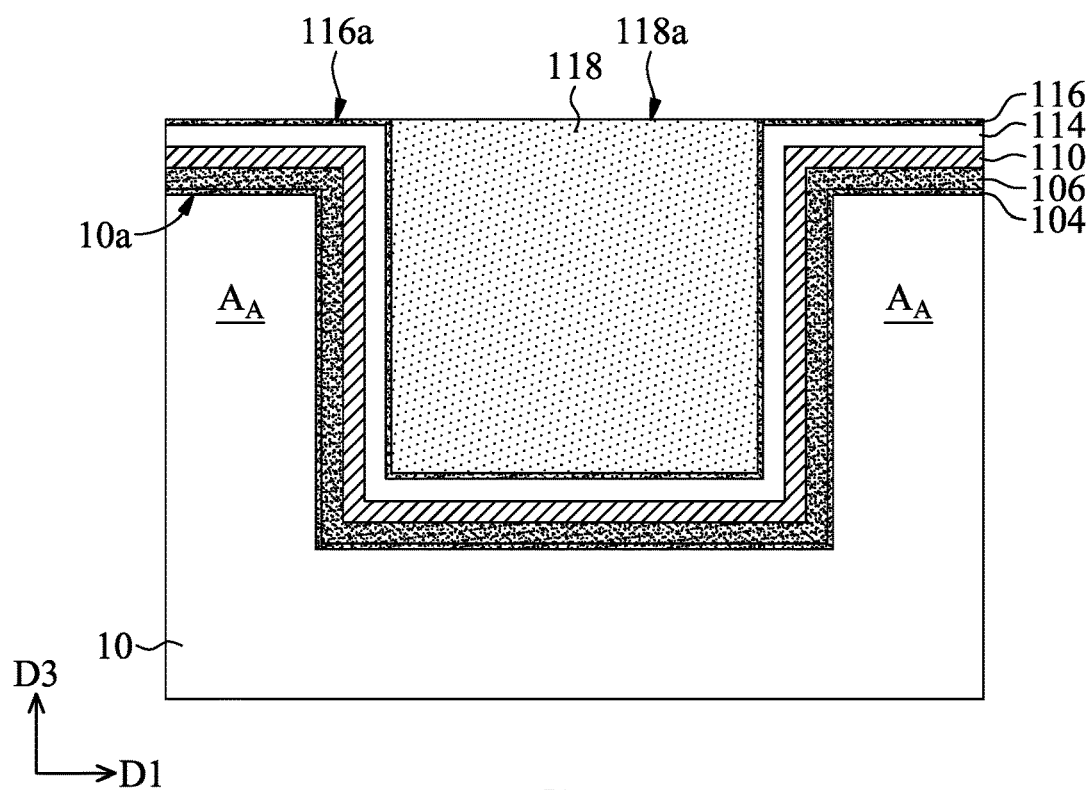

Next, referring to FIG. 7, an etch back step can be performed to remove a portion of the sacrificial material 118 to expose a top surface 116a of the native oxide 116. As shown in FIG. 7, the portion of the sacrificial material 118 above the top surface 10a of the substrate 10 and above the opening 112 is removed by etching back. In some embodiments, after this etch back step is performed, the top surface 116a of the native oxide 116 is substantially level with the top surface 118a of the remaining portion of the sacrificial material 118.

Figure 8A:
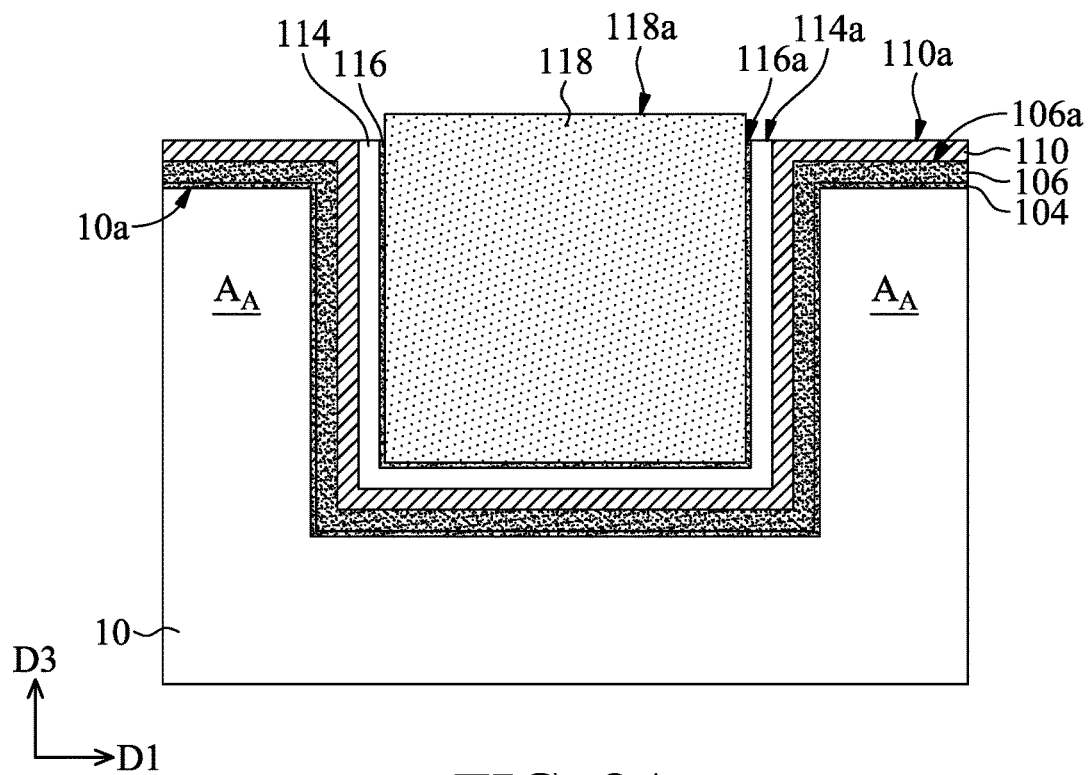
Figure 8B:
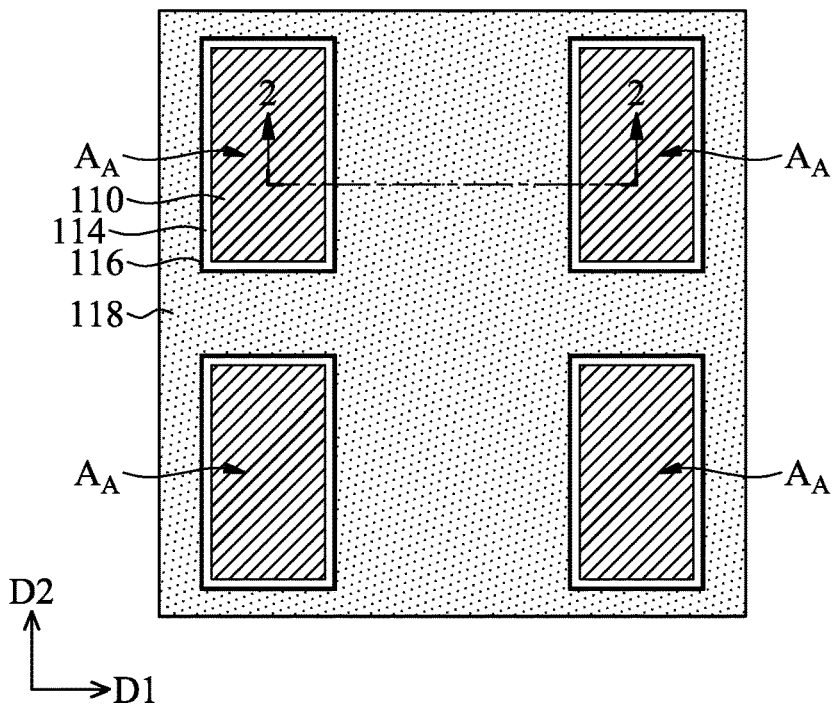

Referring to FIG. 8A and FIG. 8B, a portion of the native oxide 116 and a portion of the nitride layer 114 are removed to expose the top surface 110a of the protective layer 110. In some embodiments, a portion of the native oxide 116 can first be removed by etching to expose the top surface 114a of the nitride layer 114 above the top surface 10a of the substrate 10, and then a portion of the nitride layer 114 above the top surface 10a of the substrate 10 can be removed to expose the top surface 110a of the protective layer 110. In some embodiments, the nitride layer 114 is removed by an etch back step. In one example, the portion of the native oxide 116 is removed with a hydrofluoric acid solution, and the portion of the nitride layer 114 is removed with hot phosphoric acid.

Moreover, after removing the portion of the nitride layer 114, in accordance with some embodiments, a portion of the native oxide 116 higher than the top surface 114a of the nitride layer 114 can be further removed, so that the top surface 114a of the nitride layer 114 is substantially level with the top surface 116a of the native oxide 116. As shown in FIG. 8A, the top surface 116a of the native oxide 116, the top surface 114a of the nitride layer 114 and the top surface 110a of the top surface 110a of the nitride layer 114 after etching.

Figure 9A:
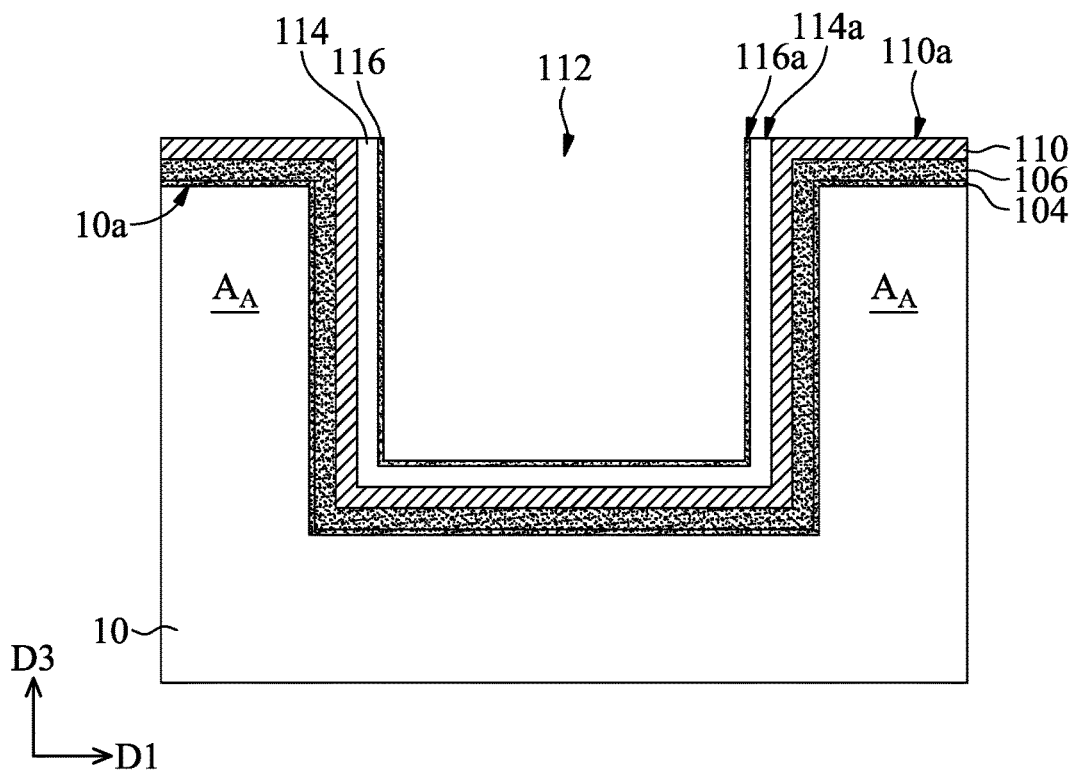
Figure 9B:
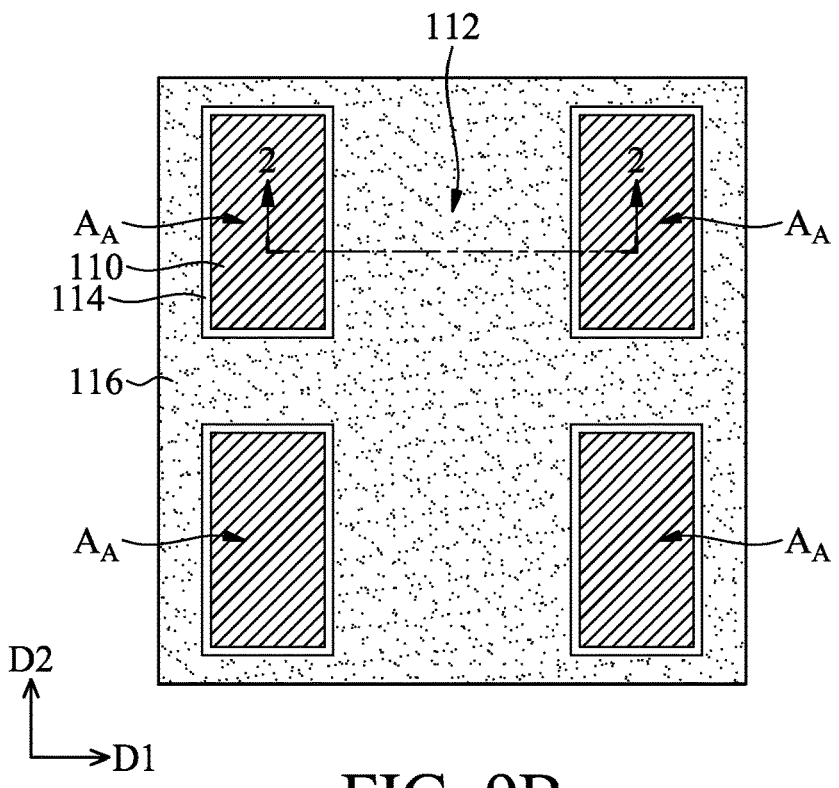

Next, referring to FIG. 9A and FIG. 9B, the remaining portion of the sacrificial material 118 is removed to expose the opening 112. In some embodiments, the sacrificial material 118 filling the opening 112 can be removed by an ashing method.

Also, as shown in FIG. 9B, the nitride layer 114 is disposed outside the active areas $A_A$ and surrounds the active areas $A_A$ from a top view of the substrate 10, wherein the nitride layer 114 surrounds the protective layer 110.

Figure 10A:
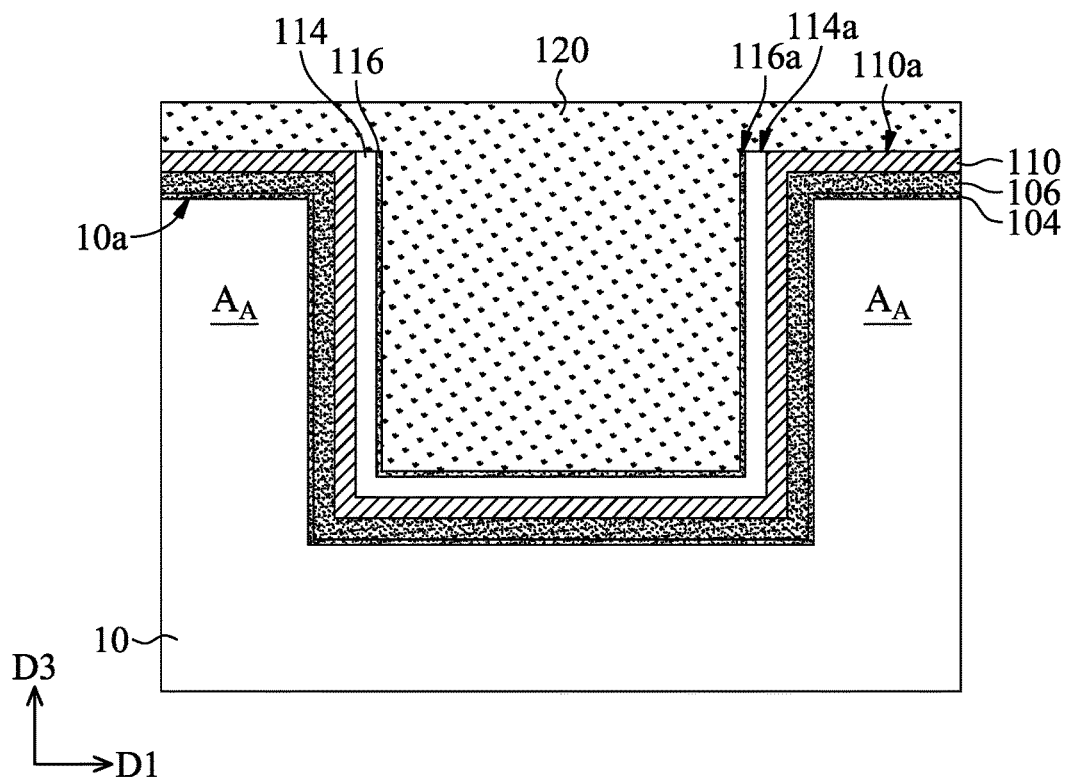
Figure 10B:
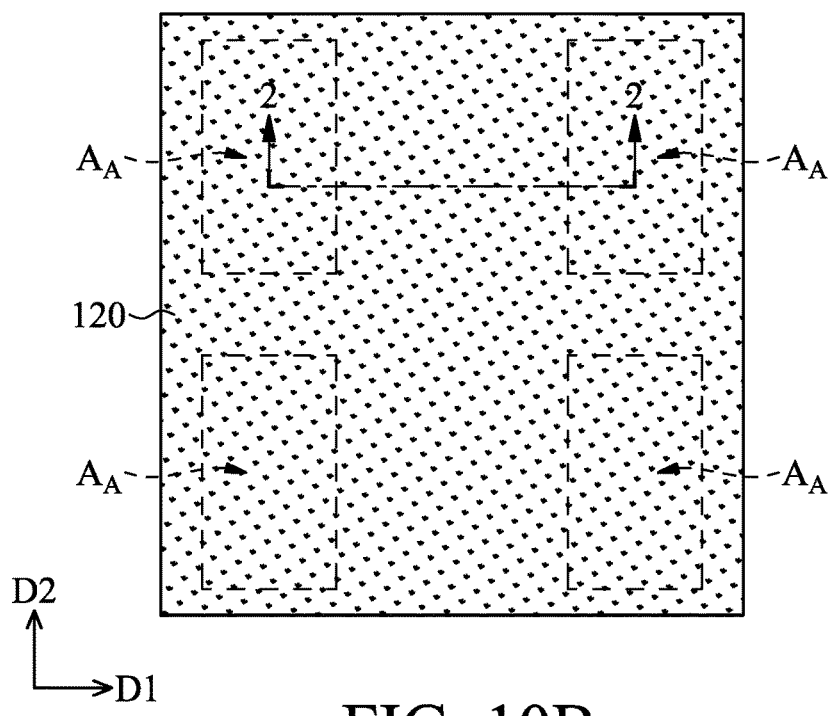

Referring to FIG. 10A and FIG. 10B, an insulating material layer 120 is then formed on the protective layer 110, and the opening 112 is filled with the insulating material layer 120. In some embodiments, the insulating material layer 120 includes a low-k dielectric material, such as a dielectric layer with a dielectric constant that is lower than 4. In one example, the insulating material layer 120 is a spin-on-glass (SOG) material. The spin-on-glass (SOG) material has a dielectric constant that is lower than 3.5. Also, the spin-on-glass (SOG) material has good gap-filling characteristics and step-covering ability, which can be selected as the insulating material layer 120 for filling up the opening 112. In some embodiments, the insulating material layer 120 is formed by spin-on deposition or another suitable deposition. Method for forming the insulating material layer 120 can be determined based on the selected material in the application.

Figure 11A:
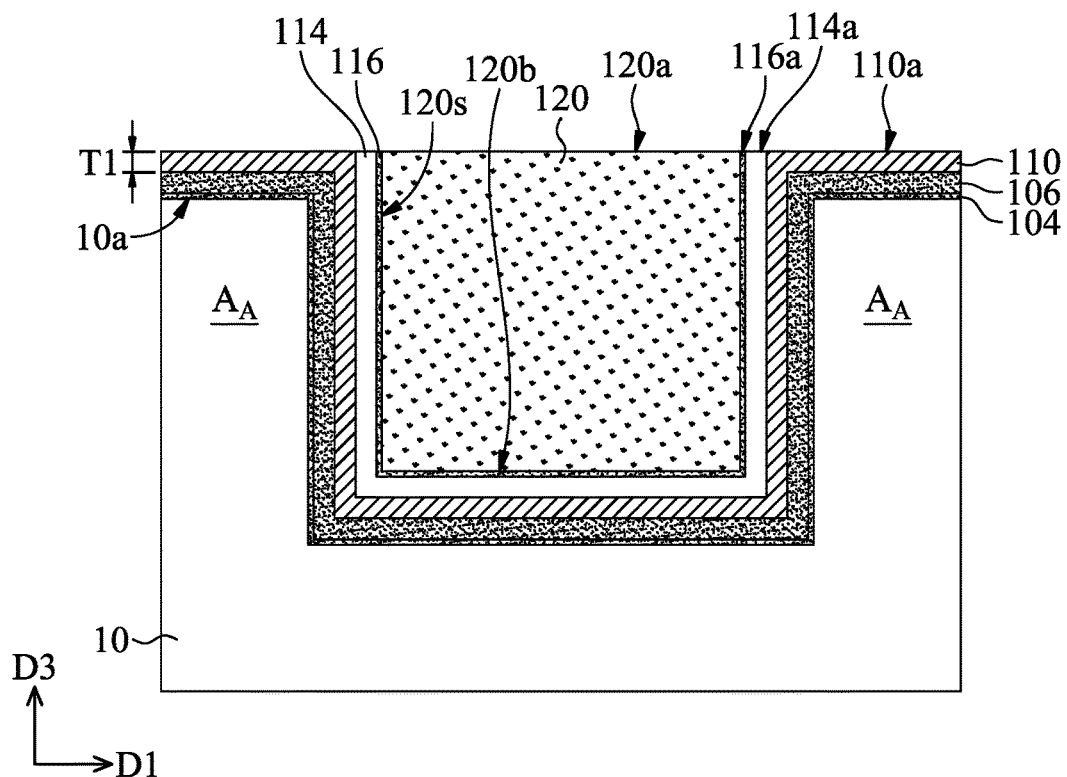
Figure 11B:
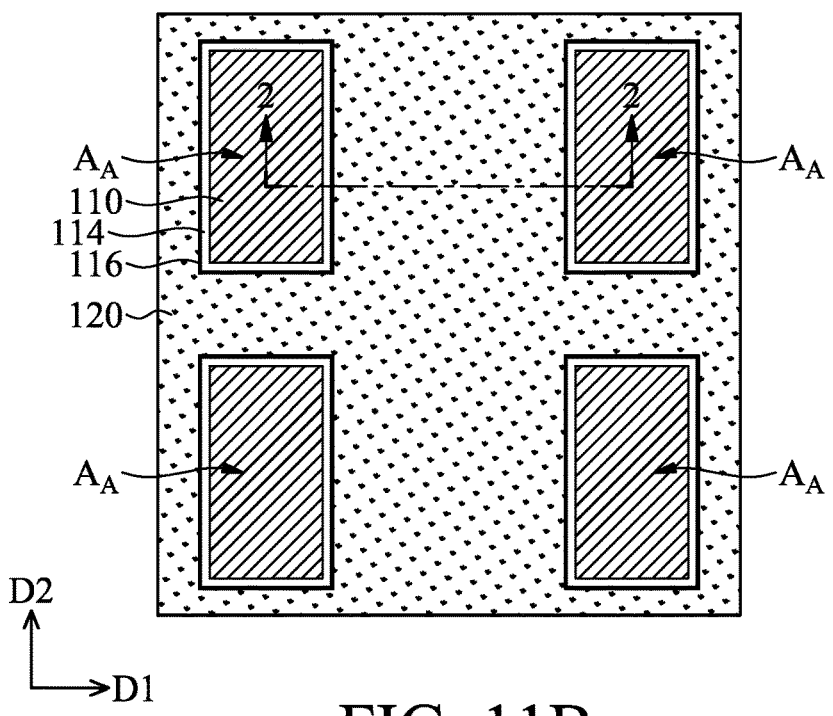

Referring to FIG. 11A and FIG. 11B, in some embodiments, a portion of the insulating material layer 120 is removed to expose the top surface 110a of the protective layer 110, and the opening 112 is fully filled with the remaining portion of the insulating material layer 120. In some embodiments, the portion of the insulating material layer 120 above the top surface 10a of the substrate 10 and above the opening 112 can be removed by chemical mechanical polishing (CMP), until the top surface 110a of the protective layer 110 is exposed. Therefore, the protective layer 110 functions as a stop layer in the manufacturing method to define the top surface 120a of the insulating material layer 120 in the opening 112, in accordance with some embodiments of the present disclosure. As shown in FIG. 11A, after this removing step is performed to expose the top surface 110a of the protective layer 110, the top surface 120a of the insulating material layer 120, the top surface 116a of the native oxide 116, the top surface 114a of the nitride layer 114 and the top surface 110a of the protective layer 110 are substantially coplanar.

Moreover, as shown in FIG. 11B, the native oxide 116 is formed at the sidewalls 120s and the bottom surface 120b of the remaining portion of the insulating material layer 120 disposed between two of the active areas $A_A$. From a top view of the substrate 10, the native oxide 116 is disposed outside the active areas $A_A$ and surrounds the nitride layer 114, and the nitride layer 114 surrounds the protective layer 110.

Figure 12A:
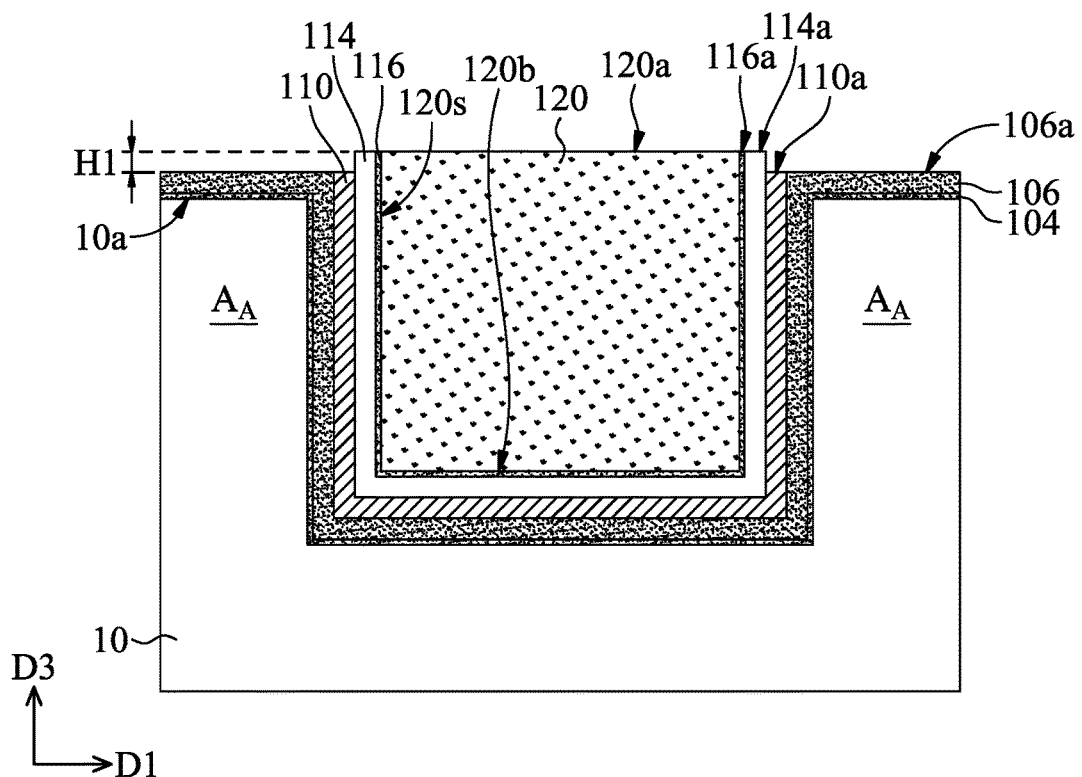
Figure 12B:
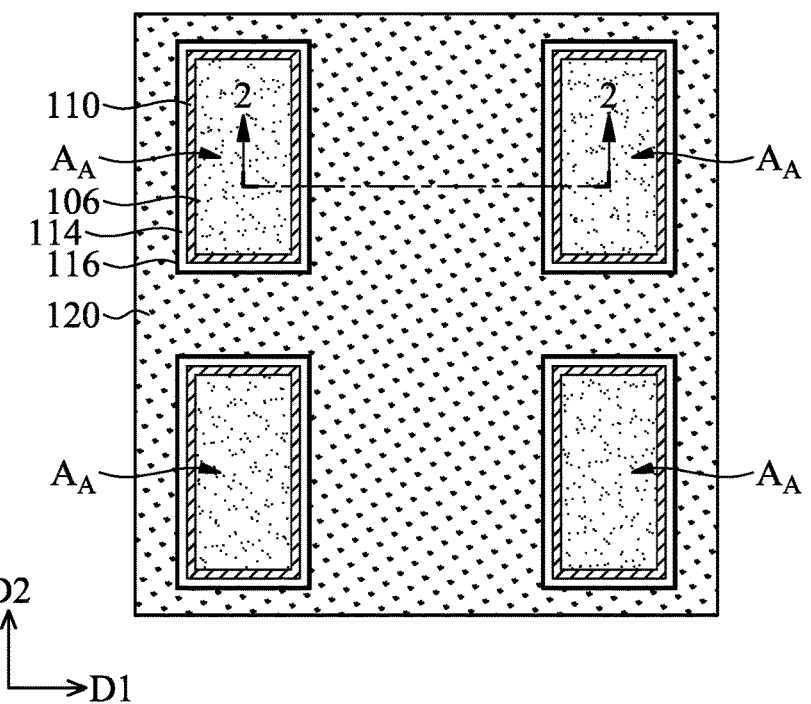

Referring to FIG. 12A and FIG. 12B, a portion of the protective layer 110 is removed to expose the top surface of the second oxide layer 106. In one embodiment, a portion of the protective layer 110 is removed by an etch back step. According to the manufacturing method as described above, a semiconductor structure with trench isolation features is completed.

In some embodiments, the semiconductor structure manufactured by the method includes several trench isolation features at the substrate 10. Each of the trench isolation features is extended downwardly along the third direction D3, as shown in FIG. 12A. In some embodiments, the trench isolation feature may be composed of oxide layers (including the first oxide layer 104 and the second oxide layer 106) at the sidewalls of the trench, the protective layer 110, the nitride layer 114 and the insulating material layer 120.

Also, in some embodiments, after a portion of the protective layer 110 is removed to expose the top surface 106a of the second oxide layer 106 (FIG. 12A), the top surface 110a of the remaining portion of the protective layer 110 is level with the top surface 106a of the second oxide layer 106, and the top surface 120a of the insulating material layer 120 in the opening 112 is level with the top surface 114a of the nitride layer 114, as shown in FIG. 12A. It should be noted that the top surface 120a of the insulating material layer 120 and the top surface 114a of the nitride layer 114 are higher than the top surface 110a of the protective layer 110 and the top surface 116a of the native oxide 116.

Additionally, referring to FIG. 11B and FIG. 12B for comparing the configuration from a top view of the substrate 10. As shown in FIG. 12B, the top surface 106a of the second oxide layer 106 is exposed in the active areas $A_A$, wherein the protective layer 110 surrounds the second oxide layer 106.

According to the aforementioned embodiments, an oxide layer and a protective layer are conformally formed on the substrate 10. Then, related steps are performed, such as forming the nitride layer 114 and the insulating material layer 120 in the opening 112 within the trench 102. The protective layer allows the height difference (also referred to as the "step height") between the top surface of the trench isolation feature in the trench and the top surface of the oxide layer outside the trench to be accurately controlled. In one example, the height difference H1 between the top surface 120a of the insulating material layer 120 and the top surface 106a of the second oxide layer 106 is equal to the thickness T1 of the protective layer 110. Also, according to some embodiments of the aforementioned manufacturing method, the insulating material layer 120 does not suffer from material loss, and a semiconductor structure with an improved profile can be obtained. For example, each of the trench isolation features of the semiconductor structure as manufactured has a complete profile and a flat top surface, thereby improving the electrical performance of the electronic features subsequently formed on the semiconductor structure.

In the aforementioned embodiment, after the remaining portion of the sacrificial material 118 is removed, the insulating material layer 120 is subsequently filled into the opening 112 (FIG. 9A-FIG. 10A), so that the insulating material layer 120 may be in direct contact with the native oxide 116. However, the disclosure is not limited to those steps. In some other embodiments, the native oxide 116 grown on the nitride layer 114 can be removed before forming the sacrificial material 118. In some other embodiments, the native oxide 116 grown on the nitride layer 114 can be removed after forming the sacrificial material 118 and before filling the insulating material layer 120 into the opening 120.

One example provided below illustrates another method for forming the insulating material layer 120 in the opening 120 after removing the sacrificial material 118 and the native oxide 116 in the opening 112, and a semiconductor structure fabricated by this method, in accordance with some other embodiments.

Figure 13:
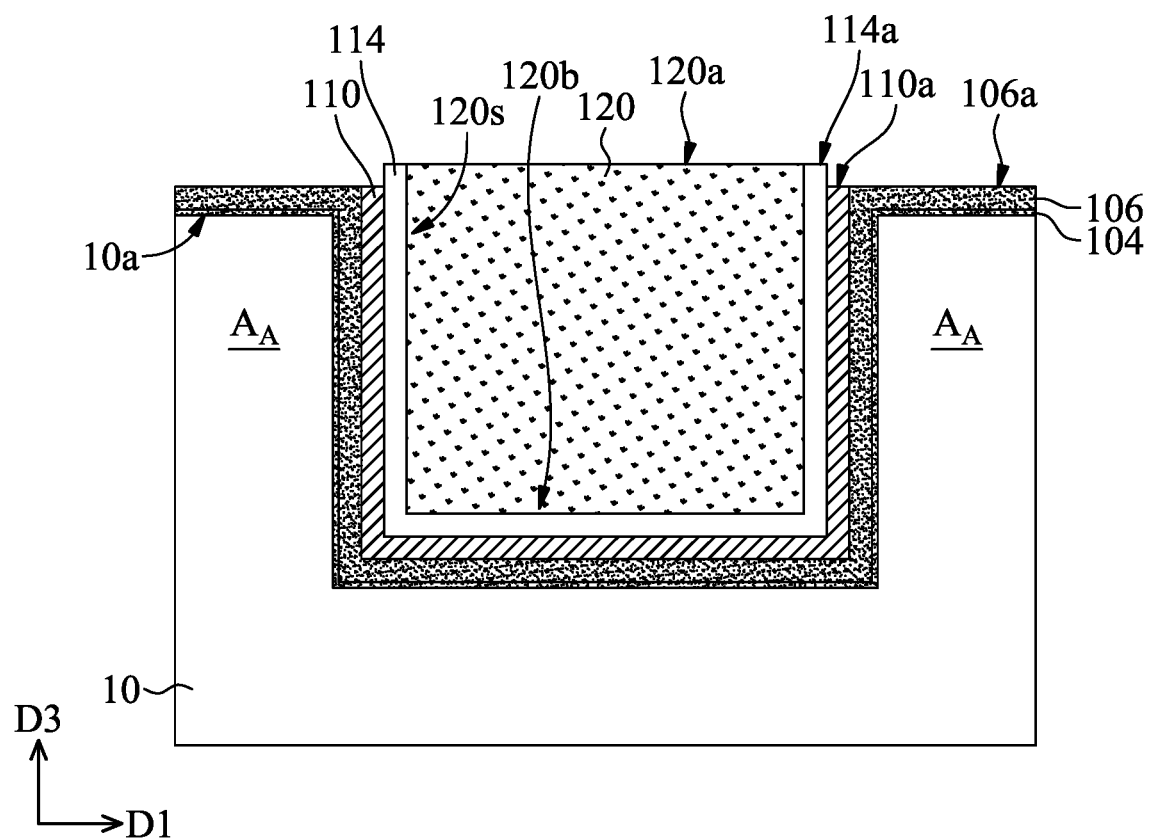

FIG. 13 is a cross-sectional view of another semiconductor structure in accordance with some embodiments of the present disclosure. The features in FIG. 13 and processes for forming the same can be referred to the aforementioned process steps such as FIG. 1A, FIG. 2-FIG. 7, FIG. 8A and FIG. 9A. The features/components in FIG. 13 identical or similar to those in FIG. 1A-FIG. 12B are designated by the same or similar reference numbers, and the details are not repeated herein. Also, the materials and forming method of the features/components in FIG. 13 identical to those in FIG. 1A-FIG. 12B have been described above and are not repeated herein.

As shown in FIG. 8A and FIG. 9A, the remaining portion of the sacrificial material 118 in the opening 112 is removed to expose the native oxide 116. Then, the native oxide 116 in the opening 112 is removed (for example, using hydrofluoric acid) to expose the nitride layer 114 in the opening 112.

After the native oxide 116 in the opening 112 is removed, an insulating material layer 120 is immediately formed on the protective layer 110, and the opening 112 is filled with the insulating material layer 120. The insulating material layer 120 is in direct contact with the top surface 110a of the protective layer 110 and the nitride layer 114. In some embodiments, the insulating material layer 120 is formed by spin-on deposition or another suitable deposition method to fill the opening 112. The insulating material layer 120 can be a spin-on-glass (SOG) material or another suitable material.

Next, a portion of the insulating material layer 120 is removed to expose the top surface 110a of the protective layer 110, and the opening 112 is fully filled with the remaining portion of the insulating material layer 120. The portion of the insulating material layer 120 can be removed by chemical mechanical polishing (CMP). Therefore, the protective layer 110 functions as a stop layer in the manufacturing method to define the top surface 120a of the insulating material layer 120 in the opening 112, in accordance with some embodiments of the present disclosure. After this removing step is performed to expose the top surface 110a of the protective layer 110, the top surface 120a of the insulating material layer 120, the top surface 114a of the nitride layer 114 and the top surface 110a of the protective layer 110 are substantially coplanar.

Next, as shown in FIG. 13, a portion of the protective layer 110 is removed to expose the top surface of the second oxide layer 106. In one embodiment, a portion of the protective layer 110 is removed by an etch back step.

In some embodiments, the semiconductor structure manufactured by this method includes several trench isolation features at the substrate 10, wherein the trench isolation features are extended downwardly along the third direction D3. As shown in FIG. 13, the trench isolation feature is composed of oxide layers (including the first oxide layer 104 and the second oxide layer 106) at the sidewalls of the trench, the protective layer 110, the nitride layer 114 and the insulating material layer 120. Also, the top surface 120a of the insulating material layer 120 in the opening 112 is level with the top surface 114a of the nitride layer 114, but higher than the top surface 110a of the remaining portion of the protective layer 110. Compared with the native oxide 116 between the nitride layer 114 and the insulating material layer 120 in the semiconductor structure shown in FIG. 12A, the nitride layer 114 of the semiconductor structure shown in FIG. 13 is in direct contact with and covers the sidewalls 120s and the bottom surface 120b of the insulating material layer 120.

It should be noted that the removal of the native oxide 116 is not only performed after forming the sacrificial material 118 and before filling the insulating material layer 120 as describe above, but also can be performed before forming the sacrificial material 118. In some other embodiments, after the native oxide 116 is formed on the nitride layer 114 (as shown in FIG. 5), the native oxide 116 is removed, and then a sacrificial material 118 is filled into the opening 112. Then, the subsequently processes (for example, removing a portion of the sacrificial material 118 to expose the top surface 114a of the nitride layer 114, removing a portion of the nitride layer 114 to expose the top surface 110a of the protective layer 110, replacing the sacrificial material 118 in the opening 112 with an insulating material layer 120, and removing a portion of the protective layer 110 to expose the top surface of the oxide layer) are performed. The finally formed semiconductor structure with trench isolation features is identical to the semiconductor structure shown in FIG. 13, and the details are not redundantly described herein.

According to some embodiments of the aforementioned manufacturing method, the oxide layers (such as the first oxide layer 104 and the second oxide layer 106) are formed on the substrate 10 with the trenches 102, and a protective layer is then conformally formed on the oxide layers, followed by subsequent processes to manufacture the semiconductor structure. The height difference (which can also be referred to as the "step height") between the top surface of the trench isolation feature in the trench and the top surface of the oxide layers outside the trench can be accurately controlled by forming the protective layer. In some embodiments, the height difference H1 between the top surface 120a of the insulating material layer 120 and the top surface 106a of the second oxide layer 106 is equal to the thickness T1 of the protective layer 110. Therefore, the protective layer 110 with a suitable thickness and the manufacturing method as described above can be adopted, based on the height difference H1 between the top surface of the trench isolation feature in the trench and the top surface of the oxide layers outside the trench required in the application, to complete the semiconductor structure in accordance with some embodiments.

Additionally, in some embodiments, the protective layer 110 is disposed between the oxide layer and the nitride layer 114, and the top surface 114a of the nitride layer 114 is defined using the sacrificial material 118. Then, the sacrificial material 118 in the opening 112 is replaced by the insulating material layer 120, and a portion of the protective layer 110 is removed to expose the top surface of the oxide layer. In the manufacturing method, the insulating material layer 120 does not suffer from material loss during the removal of the protective layer 110. Therefore, according to some embodiments of the aforementioned method of manufacturing a semiconductor structure, a semiconductor structure with a good profile can be obtained. For example, each of the trench isolation features of the semiconductor structure as manufactured has a complete profile and a flat top surface. According to some embodiments of the semiconductor structure and methods of manufacturing the same, the problem with the step height being difficult to control due to material loss in the trench isolation features—a problem that can occur in the conventional manufacturing method—can be solved, and the production yield of the semiconductor structure can be increased, thereby improving the electrical performance of the electronic features subsequently formed on the semiconductor structure.

While the disclosure has been described by way of example and in terms of the preferred embodiments, it should be understood that the disclosure is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor structure, comprising:
   a substrate having a trench recessed from a top surface of the substrate; and
   a trench isolation feature, comprising:
      an oxide layer conformally formed in the trench, wherein the oxide layer extends to the top surface of the substrate to define a top surface of the oxide layer;
      a protective layer in the trench, the protective layer conformally formed on the oxide layer; and
      an insulating material layer in the trench, the insulating material layer formed above the protective layer,
   wherein a top surface of the protective layer is higher than the top surface of the substrate, and a top surface of the insulating material layer is higher than a top surface of the protective layer, and
   wherein a height difference between the top surface of the insulating material layer and the top surface of the oxide layer is equal to a thickness of the protective layer.

2. The semiconductor structure as claimed in claim 1, wherein the top surface of the oxide layer is level with the top surface of the protective layer.

3. The semiconductor structure as claimed in claim 1, wherein the insulating material layer and the protective layer are separated by a nitride layer, and the nitride layer is formed in the trench and conformally formed on the protective layer, and the insulating material layer is formed on the nitride layer, wherein a top surface of the nitride layer is level with the top surface of the insulating material layer.

4. The semiconductor structure as claimed in claim 3, wherein the top surface of the nitride layer is higher than the top surface of the protective layer.

5. The semiconductor structure as claimed in claim 3, further comprising a native oxide conformally formed on the nitride layer, and the native oxide formed between the nitride layer and the insulating material layer, wherein a top surface of the native oxide is level with the top surface of the insulating material layer.

6. The semiconductor structure as claimed in claim 3, wherein the oxide layer extends to the top surface of the substrate outside the trench to define the top surface of the oxide layer, wherein a height difference between the top surface of the nitride layer and the top surface of the oxide layer is equal to the thickness of the protective layer.

7. The semiconductor structure as claimed in claim 1, wherein the protective layer comprises a polysilicon layer, and the insulating material layer comprises a dielectric layer with a dielectric constant that is lower than 4.

8. The semiconductor structure as claimed in claim 1, wherein the insulating material layer is a spin-on-glass (SOG) material.

9. A method of manufacturing a semiconductor structure, comprising:
   providing a substrate, the substrate having a trench recessed from a top surface of the substrate; and
   forming a trench isolation feature, comprising:
      sequentially forming an oxide layer and a protective layer on the substrate, wherein the oxide layer and the protective layer are conformally formed in the trench, thereby forming an opening in the trench, and wherein the oxide layer extends to the top surface of the substrate to define a top surface of the oxide layer;
      forming a sacrificial material above the protective layer, wherein the opening is filled with the sacrificial material;
      removing a portion of the sacrificial material to expose a top surface of the protective layer;
      removing a remaining portion of the sacrificial material to expose the opening;
      forming an insulating material layer in the opening; and
      removing a portion of the protective layer to expose the top surface of the oxide layer;
   wherein the top surface of the protective layer is higher than the top surface of the substrate, and a top surface of the insulating material layer is higher than the top surface of the protective layer, and
   wherein a height difference between the top surface of the insulating material layer and the top surface of the oxide layer is equal to a thickness of the protective layer.

10. The method of manufacturing the semiconductor structure as claimed in claim 9, wherein the top surface of the oxide layer is level with the top surface of the protective layer.

11. The method of manufacturing the semiconductor structure as claimed in claim 9, further comprising sequentially forming the oxide layer, the protective layer and a nitride layer on the substrate, wherein the oxide layer, the protective layer and the nitride layer are conformally formed in the trench, thereby forming the opening in the trench, wherein the sacrificial material in the opening is formed on the nitride layer, and the insulating material layer and the protective layer are separated by the nitride layer,
   wherein after forming the sacrificial material above the protective layer and before removing the remaining portion of the sacrificial material, the method further comprises:
      etching back the portion of the sacrificial material to expose a top surface of the nitride layer; and
      removing a portion of the nitride layer to expose the top surface of the protective layer.

12. The method of manufacturing the semiconductor structure as claimed in claim 11, wherein after forming the nitride layer, the method further comprises:

forming a native oxide conformally on the nitride layer, wherein the insulating material layer in the opening is formed on the native oxide and is in direct contact with the native oxide.

13. The method of manufacturing the semiconductor structure as claimed in claim 12, wherein a top surface of the native oxide is level with the top surface of the insulating material layer.

14. The method of manufacturing the semiconductor structure as claimed in claim 11, wherein a height difference between the top surface of the nitride layer and the top surface of the oxide layer is equal to the thickness of the protective layer.

15. The method of manufacturing the semiconductor structure as claimed in claim 9, wherein the steps of forming the insulating material layer in the opening and removing the portion of the protective layer comprise:
   forming the insulating material layer on the protective layer, and the opening filled with the insulating material layer;
   removing a portion of the insulating material layer to expose the top surface of the protective layer, wherein the opening is filled with the remaining portion of the insulating material layer; and
   etching back the protective layer to remove the portion of the protective layer on the top surface of the substrate to expose the top surface of the oxide layer.

16. The method of manufacturing the semiconductor structure as claimed in claim 9, wherein the protective layer comprises polysilicon.

* * * * *